US011016211B2

(12) United States Patent
Zhan et al.

(10) Patent No.: US 11,016,211 B2
(45) Date of Patent: May 25, 2021

(54) 4D TIME SHIFT AND AMPLITUDE JOINT INVERSION FOR OBTAINING QUANTITATIVE SATURATION AND PRESSURE SEPARATION

(71) Applicants: Xin Zhan, Sugar Land, TX (US); Dezhi Chu, Houston, TX (US); John E. Bishop, Houston, TX (US); Xinyou Lu, Bellaire, TX (US); David D McAdow, Houston, TX (US); Brent D. Wheelock, Houston, TX (US)

(72) Inventors: Xin Zhan, Sugar Land, TX (US); Dezhi Chu, Houston, TX (US); John E. Bishop, Houston, TX (US); Xinyou Lu, Bellaire, TX (US); David D McAdow, Houston, TX (US); Brent D. Wheelock, Houston, TX (US)

(73) Assignee: ExxonMobil Upstream Research Company, Spring, TX (US)

( * ) Notice: Subject to any disclaimer, the term of this patent is extended or adjusted under 35 U.S.C. 154(b) by 498 days.

(21) Appl. No.: 15/912,201

(22) Filed: Mar. 5, 2018

(65) Prior Publication Data
US 2018/0275303 A1 Sep. 27, 2018

Related U.S. Application Data

(60) Provisional application No. 62/476,263, filed on Mar. 24, 2017, provisional application No. 62/503,661, filed on May 9, 2017.

(51) Int. Cl.
*G01V 1/30* (2006.01)
*G01V 1/28* (2006.01)
*G06F 30/00* (2020.01)

(52) U.S. Cl.
CPC .............. *G01V 1/308* (2013.01); *G01V 1/282* (2013.01); *G01V 1/303* (2013.01); *G01V 2210/632* (2013.01); *G06F 30/00* (2020.01)

(58) Field of Classification Search
CPC ........ G01V 1/308; G01V 1/303; G01V 1/282; G01V 2210/632; G01V 2210/16; G01V 2210/6161; G01V 2210/1216; G06F 30/00
(Continued)

(56) References Cited

U.S. PATENT DOCUMENTS

| | | | |
|---|---|---|---|
| 6,876,928 B2 * | 4/2005 | Van Riel | G01V 1/306 702/16 |
| 8,451,683 B2 * | 5/2013 | Chu | G01V 1/30 367/38 |

(Continued)

OTHER PUBLICATIONS

Yang, Di et al., "Time-lapse Full-Waveform Inversion with Ocean-Bottom-Cable Data: Application on Valhall Field", Jul.-Aug. 2016, Geophysics, vol. 81, No. 4, Society of Exploration Geophysicists. (Year: 2016).*

(Continued)

*Primary Examiner* — Cedric Johnson
(74) *Attorney, Agent, or Firm* — ExxonMobil Upstream Research Company, Law Department

(57) ABSTRACT

A method for inversion of 4D seismic data, including: determining time shift between baseline and monitor geophysical datasets; determining time strain from the time shift; iteratively repeating until a stopping criteria is satisfied, performing an iterative elastic AVO inversion with a 4D difference providing an update, from an initial model including the time strain, to generate an updated time strain and an updated physical property model, wherein the stopping criteria is a misfit between synthetic data generated from the updated physical property model and the 4D difference (Continued)

being within a predetermined noise level generating final values for the physical property model; and converting, with a rock physics model or a reservoir simulation model, the final values to saturation and/or pressure changes for a subsurface region.

13 Claims, 3 Drawing Sheets

(58) Field of Classification Search
USPC .................................................. 703/10, 6
See application file for complete search history.

(56) References Cited

U.S. PATENT DOCUMENTS

| 8,483,964 | B2 | 7/2013 | Chu | |
|---|---|---|---|---|
| 8,908,474 | B2* | 12/2014 | Chu | G01V 11/00 367/73 |
| 9,110,190 | B2* | 8/2015 | Yogeswaren | G01V 1/308 |
| 2010/0142323 | A1* | 6/2010 | Chu | G01V 11/00 367/73 |

OTHER PUBLICATIONS

Xu, Shiyu et al., "A New Velocity Model for Clay-Sand Mixtures", 1995, 54th EAEG, Geophysical Prospecting. (Year: 1995).*
Floricich, Mariano et al. "Determination of a Seismic and Engineering Consistent Petro-Elastic Model for Time-Lapse Seismic Studies: Application to the Schiehallion Field", 2006, SEG/New Orleans Annual Meeting. (Year: 2006).*
Floricich, M. et al. "Probabilistic Inversion of Multiple 4D Seismic as Applied on Schiehallion Field", Jun. 4-7, 2012, 74th EAGE Conference & Exhibition, Copenhagen '12. (Year: 2012).*
Blanchard, T. D., (2012), "Inherent uncertainties in 4D AVO and the implications on pressure and saturation inversion" *74th Conference and Exhibition*, EAGE, Extended Abstracts, Y020; 5 pages.
Cole, S., D., et al. (2002), "Pressure and saturation inversion of 4D seismic data by rock physics forward modeling" *72nd Annual International Meeting, SEG, Expanded Abstracts*, pp. 2475-2478.
De Nicolao, A., et al. (1993), "Eigenvalues and eigenvectors of linearized elastic inversion" *Geophysics*, 58, pp. 670-679.
Edgar, J.A., et al. (2015), "Imposing geological and geomechanical constraints on time-lapse time strain inversion", *77th EAGE Conference and Exhibition*; 5 pages.
Griffiths, L., et al. (2015), "Trace warping vs. impedance warping in 4D seismic inversion", *77th EAGE Conference and Exhibition* 2015; 5 pages.
Landro, M., (2001), "Discrimination between pressure and fluid saturation changes from time-lapse seismic data", *Geophysics*, 66, pp. 836-844.
Lumley, D., M. et al. (2003), "Estimation of reservoir pressure and saturation by crossplot inversion of 4D seismic attributes" *73rd Annual International Meeting, SEG*, Expanded Abstracts, pp. 1513-1516.
Micksch, U., et al. (2014) "Integrated 4D inversion approach in Danish chalk fields", *76th EAGE Conference and Exhibition*; 5 pages.
Rickett, J.E., et al. (2001) "Cross-equalization data processing for time-lapse seismic reservoir monitoring: A case study from the Gulf of Mexico" *Geophysics*, 66, pp. 1015-1025.

Tian, S., et al., (2015) "An engineering-consistent Bayesian scheme for 4D seismic to simulator inversion", *77th EAGE Conference and Exhibition*; 5 pages.
Tura, A., et al., (1999) "Estimating pressure and saturation changes from time-lapse AVO data" *69th Annual International Meeting, SEG, Expanded Abstracts*; pp. 1655-1658.
Williamson, P.R., et al., (2007) "A new approach to warping for quantitative time-lapse characterization", *69th EAGE Conference and Exhibition*; 5 pages.
Aki, K. and Richards, R. G. (1980) "Quantitative Seismology: Theory and Methods", W.H. Freeman and Company, pp. 123-188.
Alsos, T. et al. (2009) "The Many Faces of Pressure Changes in 4D Seismic at the Svale Field and Its Implication on Reservoir Management", 71st EAGE Conference and Exhibition, 5pgs.
Floricich, M. et al. (2005) "An Engineering-driven Approach for Separating Pressure and Saturation Using 4D Seismic: Application to a Jurassic Reservoir in the UK North Sea", 75th Annual International Meeting, SEG, Expanded Abstracts, pp. 2464-2468.
Floricich, M. et al. (2006) "Determination of a Seismic and Engineering Consistent Petro-elastic Model for Time-Lapse Seismic Studies: Application to the Schiehallion Field", 76th Annual International Meeting, SEG, Expanded Abstracts, pp. 3205-3208.
Floricich, M. et al. (2012) "Probabilistic Inversion of Multiple 4D Seismic as Applied on Schiehallion Field", 74th EAGE Conference and Exhibition incorporating SPE EUROPEC, 5pgs.
Hale, D. (2007) "A Method for Estimating Apparent Displacement Vectors from Time-lapse Seismic Images", 77th Annual Meeting of the SEG, Expanded Abstracts, Geophysics, vol. 74, No. 5, Sep.-Oct. 2009, pp. V99-V107.
Hatchell, P. J. et al. (2005) "Measuring Reservoir Compaction Using Time-Lapse Timeshifts", 75th Annual meeting of the SEG, Expanded Abstracts, pp. 2500-2504.
Hatchell, P. J. et al. (2013) "Instantaneous 4D Seismic (i4D) for Water Injection Monitoring", 75th EAGE Conference & Exhibition incorporating SPE EUROPEC 2013, 5pgs.
Hudson,T. et al. (2005) "Genesis Field, Gulf of Mexico, 4-D Project Status and Preliminary Lookback", 75th Annual Meeting of the SEG, Expanded Abstracts, pp. 2436-2440.
Janssen, A. L. et al. (2006) "Measuring Velocity Sensitivity to Production-Induced Strain at the Ekofisk Field Using Time-Lapse Time-Shifts and Compaction Logs", 76th Annual Meeting of the SEG, Expanded Abstracts, pp. 3200-3204.
Kuster, G. T., and Toksöz, M. N. (1974) "Velocity and Attenuation of Seismic Waves in Two-phase Media", Geophysics, vol. 39, No. 5, pp. 587-618.
Naeini, E. Z et al. (2009) "Simultaneous Multivintage Time-shift Estimation", Geophysics, vol. 74, No. 5, Sep.-Oct. 2009, pp. V109-V121.
Rickett, J. et al. (2006) "Compaction and 4D Time Strain at the Genesis Field", Expanded Abstracts: 76th Annual Meeting of the SEG, pp. 3215-3219.
Rickett, J. et al. (2007) "4D Time Strain and the Seismic Signature of Geomechanical Compaction at Genesis", Conference Proceedings, 69th EAGE Conference and Exhibition, May 2007, pp. 644-647.
Xu, S. and White, R. E. (1995) "A New Velocity Model for Clay-sand Mixtures", Geophysical Prospecting, Jan. 1995, vol. 43, pp. 91-118.
Xu S. and White, R. E. (1996) "A Physical Model for Shear-wave Velocity Prediction", Geophysical Prospecting, Jul. 1996, vol. 44, pp. 687-717.

* cited by examiner

4D TIME SHIFT AND AMPLITUDE JOINT INVERSION FOR OBTAINING QUANTITATIVE SATURATION AND PRESSURE SEPARATION

CROSS-REFERENCE TO RELATED APPLICATION

This application claims the benefit of U.S. Provisional Patent Application 62/476,263 filed Mar. 24, 2017 entitled 4D TIME SHIFT AND AMPLITUDE JOINT INVERSION FOR OBTAINING QUANTITATIVE SATURATION AND PRESSURE SEPARATION, and U.S. Provisional Patent Application 62/503,661 filed May 9, 2017 entitled 4D TIME SHIFT AND AMPLITUDE JOINT INVERSION FOR OBTAINING QUANTITATIVE SATURATION AND PRESSURE SEPARATION, wherein the entirety of of each of the 62/476,263 and 62/503,661 applications are incorporated herein by reference in their entirety.

TECHNOLOGICAL FIELD

This disclosure relates generally to the field of hydrocarbon reservoir analysis, and more particularly to time-lapse seismic analysis. One example pertains to a method for inverting 4D seismic data to predict saturation and pressure from changes in the 4D seismic data.

BACKGROUND

This section is intended to introduce various aspects of the art, which may be associated with exemplary embodiments of the present invention. This discussion is believed to assist in providing a framework to facilitate a better understanding of particular aspects of the present invention. Accordingly, it should be understood that this section should be read in this light, and not necessarily as admissions of prior art.

Seismic data is one of the most commonly used geophysical prospecting tools that is used to efficiently develop hydrocarbon reservoirs, which must be properly processed in order to allow interpretation of subsurface features including changes in fluid content or changes in pressure within a rock formation. Generally, seismic data is acquired by using active seismic sources to inject seismic energy into the subsurface which is then refracted or reflected by subsurface features and recorded at seismic receivers. For 4D seismic data (sometimes called time-lapse seismic data), a first realization of the subsurface is acquired, usually pre-production, to obtain a 'baseline' seismic dataset and subsequent monitoring seismic surveys are acquired over the same subsurface formation to obtain one or more 'monitor' seismic dataset(s). In practice, seismic data is often contaminated by noise which may be coherent or incoherent (e.g. random) in nature. In 4D seismic comparisons, slight differences in survey parameters and/or processing can result in differences in amplitude and/or phase which may further contaminate the results.

4D seismic comparisons could be made by directly subtracting two seismic volumes, usually a baseline and a monitor, acquired at different points in time, usually months or years apart. This is referred to as the 4D seismic difference or 4D difference. What we observe in the 4D difference are generally attributed to changes in the reservoir, assuming, of course, that the monitor and baseline data sets have undergone a similar, if not identical, processing sequence and were carefully matched to compensate for differences in acquisition geometry, mechanical source and receiver signatures etc.

In the last 10 years, many major oil companies have published their work to invert for saturation, pressure changes from 4D time-lapse seismic data. 4D seismic is impacted by fluid movement and pressure changes. Production of hydrocarbons resulting in fluid saturation changes in the subsurface will change both the velocities and density in those regions. Traveling at a different speed (compared to an earlier survey), the reflected seismic wave will arrive at surface detectors sooner or later than in the base survey. This will not only change the strength (amplitude) of the seismic signal, but also shift the apparent depth of reflecting interfaces in resulting seismic images. Moreover, unless pressure is maintained in the reservoir by fluid injection, the reflectors themselves can move downward, which is called subsidence or compaction. Thus, time shift and amplitude changes are two important aspects of 4D seismic.

The majority of existing prestack 4D inversion schemes deal with amplitude information (Tura et al., 1999; Landro., 2001; Cole et al., 2002; Lumley et al., 2003) and are heavily dependent upon the liberalized approximations of reflectivity, that have been shown in 3D to be a "hopelessly ill conditioned problem" (Nicolao et al 1993). Using different forms of approximations of the reflectivity equation and a rock physics model, a set of coefficients can be estimated to make a combination of near, mid and far or angle dependent difference amplitudes to infer (i.e., solve an inverse problem) the elastic impedance changes (Ip and Is, the product of density and acoustic wave propagation velocities for P-wave and S-wave) and saturation/pressure change. The 4D AVO inversion problem is defined in the same way, where some key 4D effects (especially pressure change) have been shown to fall along the worst determined eigenvector (Blanchard 2012). In principle, the saturation and pressure decoupling problem is better conditioned when time-shift and amplitude information are simultaneously used in the inversion to obtain P-impedance change (dIp) and S-impedance change (dIs).

There are also another group of pure statistical methods to infer saturation and pressure changes from one or multiple selected 4D attributes and that honor reservoir engineering data. A relationship between pressure and saturation changes in the reservoir and the corresponding time-lapse seismic signatures can be determined from measurements of the produced fluids and downhole pressures at a number of wells. A cycle of calibration at well location, training and choice of an optimal combination of attributes are usually required (Floricich et al., 2005, 2006; Alsos et al., 2009; Floricich et al., 2012; Hatchell et al., 2013; Tian et al., 2015). The merit of the statistical method is that no rock and fluid physics or seismic modeling is involved; while it requires and relies on accurate and repeated engineering data (pressure and fluid saturation measurements) at the wells. Very often, it does not deal with the vertical distribution of saturation and pressure change and requires complicated reservoir models for stacking reservoirs. It also takes various types of assumptions to populate saturation and pressures in between wells.

Besides amplitude variation, time shifts are commonly used to recover velocity changes and strains in subsurface after production. Recovering these time shifts can be useful for reservoir management, particularly through calibration of geomechanical models. Production will cause the pressure to decrease within the reservoir. If the pressure of the reservoir is not well maintained, compaction of the reservoir will occur, especially for younger rocks. This compaction will most likely be coupled with subsidence of the overburden and overburden dilation. A time-shift data volume can be used to quantify such effects by looking at the time shifts at different time/depth levels (Hudson et al., 2005; Hatchell et al., 2005; Rickett et al., 2006). Translation of time shifts into time strain to generate an interpretative time strain model is an evolving technical area itself. It varies from taking the first derivative of time shifts (Jansen, 2006) to an iterative nonlinear inversion (Rickett et al., 2007; Williamson et al., 2007). Both Rickett and Williamson chose to recover smoothly varying time shifts to attenuate high frequency noises in model space. More recently, Edgar (Edgar and Blanchard, 2016) introduced geologically and geomechanically consistent regularization scheme in time strain inversion, which enables accurate recovery of magnitude, shape and localization of time strain beneath, within the reservoir and throughout the overburden.

Most recently, research efforts have been directed to assimilate information from 4D time shift and amplitude. Pitfalls of utilizing time shift or AVO attributes alone include: (1) velocity and/or impedance changes derived from time shift may not fit the AVO after time alignment; and (2) given the variety of 4D anomalies, some are dominated by time shift and some are dominated by amplitude. In cases such as reservoirs underneath gas cloud and stacking reservoirs, it's difficult to recover the correct production mechanism by using time shift or amplitude information alone.

Williamson et al. presents a new approach to time alignment or 'warping' process. This approach poses the problem in terms of velocity changes and looks to explain both time shifts and amplitude changes. It integrates elements of classical warping with impedance inversion. It has limited application to where the predominant changes are in the velocity and only generates an estimate of broadband velocity change.

Micksch et al. describes an approach that utilizes time strain to build a low frequency information for the 4D impedance inversion. In the 4D inversion step, impedance changes are inverted using aligned difference volumes. Using the time strain as low frequency information provides a broadband estimate of the acoustic impedance change volume. Side lobes above and below the real 4D signals are significantly reduced when low frequency information is incorporated and the correct amplitude is recovered. The described method is limited to acoustic impedance changes and there is no iterative interaction between time strain and inverted impedance from aligned difference volumes.

Griffiths et al. extends the existing 4D inversion correction for time shift by warping seismic traces in time and then solving for small changes in impedance to warping impedance traces and solving for impedance changes. It generates more accurate impedance changes than warping seismic traces; especially when 3D and 4D signals are strong. However, it is still limited to acoustic impedance changes and no AVO inversion is involved.

U.S. Pat. No. 8,483,964, the entirety of which is hereby incorporated by reference, describes a method for deriving a reservoir property change data volume from time shifts used to time-align 4D seismic survey data. The time alignment is performed on at least one angle stack of 4D data to determine a time-shift data volume. When multiple angle stacks are used, the time shifts are corrected to zero offset. A running time window is defined, and within each window the time shifts are best fit to a straight-line function of time (depth), one angle stack at a time. The slopes from the straight line fits from different angle stacks are averaged at each voxel in the data volume, which yields a reservoir properties ($\Delta v/v$) data volume. This data volume may be filtered with a low-pass filter to improve signal-to-noise. The resulting data volume may be merged with the 4D data volume to expand its bandwidth, or it may be converted into a reservoir saturation and pressure change data volume using a rock-physics model.

U.S. Pat. No. 8,908,474, the entirety of which is hereby incorporated by reference, describes a method for inferring the saturation and pressure change of a reservoir by combining the information from 4D (time-lapse) seismic and time lag data volumes derived from the 4D seismic, well logs, and reservoir simulation results (when simulator results are available) and featuring one or more 4D well ties for a quantitative 4D interpretation. The method uses model-based inversion incorporating rock physics (2) at well locations (5), and is statistical-based (6) away from wells. The method thus allows integration (8) of rock physics model and reservoir simulation and honors 4D seismic change.

SUMMARY

A method for inversion of 4D seismic data, the method including: determining time shift between baseline and monitor geophysical datasets; determining time strain from the time shift; iteratively repeating until a stopping criteria is satisfied, performing an iterative elastic AVO inversion with a 4D difference providing an update, from an initial model including the time strain, to generate an updated time strain and an updated physical property model, wherein the stopping criteria is a misfit between synthetic data generated from the updated physical property model and the 4D difference being within a predetermined noise level, wherein for each successive iteration, the method includes generating an updated time shift from the updated time strain, generating an updated 4D difference from the updated time strain, generating a new time strain from the updated 4D difference, and repeating step the AVO inversion with the updated 4D difference and the new time strain; generating final values for the physical property model; and converting, with a rock physics model or a reservoir simulation model, the final values to saturation and/or pressure changes for a subsurface region.

In the method, the elastic AVO inversion can be performed sequentially with first the baseline dataset and secondly the monitor dataset, and the updated models from each are subtracted to have the 4D difference provide the update.

In the method, the elastic AVO inversion can performed on the 4D difference.

In the method, the final values for the physical property model are P- and S-impedance.

In the method, the rock physics model can calibrated at a well location.

In the method, the rock physics model can further calibrated with core measurements.

The method can further include performing a reservoir simulation using the saturation and/or pressure changes for the subsurface region.

In the method, the baseline and monitor geophysical datasets can pre-aligned 4D angle stacks.

In the method, the noise level is determined from a data variance in a non-production part of the reservoir.

In the method, the elastic AVO inversion can use a cost function with a trace by trace varying regularization parameter.

In the method, the performing the elastic AVO inversion can include using SVD to solve for an update to the physical property model.

A method for inversion of 4D seismic data, the method including: determining time shift between baseline and monitor geophysical datasets; determining time strain from the time shift; determining a noise level for a 4D difference between the baseline and monitor geophysical datasets; and performing an iterative elastic AVO inversion, until a stopping criteria is satisfied, with the 4D difference providing an update, from an initial model including the time strain, to generate an updated physical property model, wherein the stopping criteria is a misfit between synthetic data generated from the updated physical property model and the 4D difference being within a predetermined noise level, and wherein the time strain serves as low frequency information on the 4D difference.

A computer readable storage medium encoded with instructions, which when executed by a computer causes the computer to implement a method for inversion of 4D seismic data, the method comprising: determining time shift between baseline and monitor geophysical datasets; determining time strain from the time shift; iteratively repeating until a stopping criteria is satisfied, performing an iterative elastic AVO inversion with a 4D difference providing an update, from an initial model including the time strain, to generate an updated time strain and an updated physical property model, wherein the stopping criteria is a misfit between synthetic data generated from the updated physical property model and the 4D difference being within a predetermined noise level, wherein for each successive iteration, the method includes generating an updated time shift from the updated time strain, generating an updated 4D difference from the updated time strain, generating a new time strain from the updated 4D difference, and repeating the AVO inversion with the updated 4D difference and the new time strain; generating final values for the physical property model; and converting, with a rock physics model or a reservoir simulation model, the final values to saturation and/or pressure changes for a subsurface region.

BRIEF DESCRIPTION OF THE DRAWINGS

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims. It should also be understood that the drawings are not necessarily to scale, emphasis instead being placed upon clearly illustrating principles of exemplary embodiments of the present invention. Moreover, certain dimensions may be exaggerated to help visually convey such principles.

DETAILED DESCRIPTION OF EXAMPLE EMBODIMENTS

Figure 1:
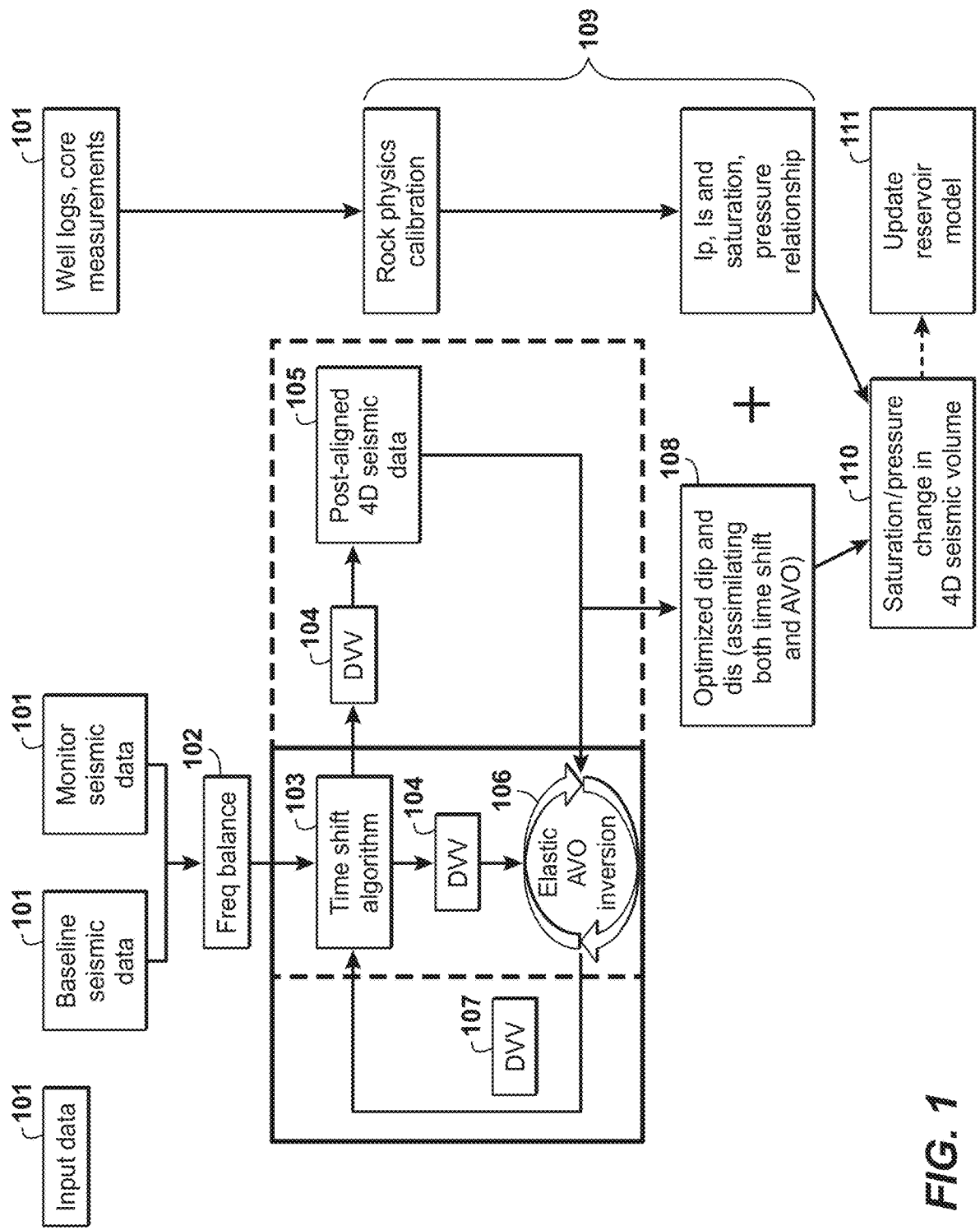
FIG. 1 illustrates a method embodying the present technological advancement.

Exemplary embodiments are described herein. However, to the extent that the following description is specific to a particular embodiment, this is intended to be for exemplary purposes only and simply provides a description of the exemplary embodiments. Accordingly, the invention is not limited to the specific embodiments described below, but rather, it includes all alternatives, modifications, and equivalents falling within the true spirit and scope of the appended claims.

With increasing quality of seismic acquisition and processing providing better 4D seismic repeatability in the last 10 years, translation of 4D seismic anomalies into quantitative dynamic properties (pressures, saturations) is becoming more feasible. Converting relative 4D amplitude and time shift information into physical reservoir properties of saturation and pressure could cause a step change in discriminating such events as unswept hydrocarbons from pressure changes, leading to new infill drill well opportunities and optimized field development. 4D time lapse seismic is the only field-wide history match constraint to describe variations of reservoir properties during field production, especially pressure variations and fluid replacement. Currently, one compares simulator results and 4D seismic data by comparing synthetic seismic data modeled using the simulator to measured 4D seismic difference data; alternatively, acoustic impedance (the product of density and acoustic velocity) modeled using a simulator is compared to inverted impedance, i.e. impedance (as a function of subsurface spatial location) inferred by inversion of seismic data, if inversion has been done. Ideally, the simulator model will be adjusted, or updated, using reservoir properties derived from quantitative 4D, i.e. saturation change and pressure change over time. In time lapse studies, inversion is the key when 4D seismic attributes are interpreted in terms of fluid and pressure changes linked to production mechanism.

Pressure change is simply the difference between monitor reservoir pressure and base reservoir pressure. Saturation change includes three separate saturation measurements; gas saturation (S1), oil saturation (S2), and water saturation (S3). These three quantities always satisfy S1+S2+S3=1. To infer saturation change from 4D seismic, a single quantity can be constructed to represent the changes in all three saturations. It is known that oil saturation rarely increases and that an increase of gas saturation causes a decrease in P-impedance, whereas an increase in water saturation causes an increase in P-impedance. (A P-wave is the primary seismic wave in seismic exploration, and is defined by particle motion in the direction of wave propagation; whereas an S-wave is defined by particle motion in the direction perpendicular to that of wave propagation.)

To achieve the ultimate goal of saturation and pressure separation and quantification, the present technological advancement can assimilate time shift and 4D AVO attributes. Joint inversion of 4D seismic data of time shift and amplitude changes between baseline and monitor offset seismic cubes can be carried out to invert for elastic impedance change (P-impedance and S-impedance changes) volumes. Rock physics relationships between elastic impedance changes and saturation/pressure changes can be established using well logs and core measurements.

The present technological advancement can take pre-aligned 4D seismic data as the input. After frequency balancing (cross equalization) between the baseline and monitor seismic data, a time shift algorithm can be used to calculate time shift between base line and monitor seismic data. The term time shift refers to comparison of time-lapse data and determining the arrival time correction needed to align the subsurface structure in the later data set with that of the earlier data set. Time shift is then converted into time strain, which is defined as the percentage changes in velocity between baseline and monitors (dvv). The present technological advancement can proceed to elastic AVO (amplitude variation with offset) inversion in multiple way.

Two different options are illustrated FIG. 1; depending on whether time shift is updated during the inversion. A first option is illustrated in FIG. 1 in the dashed box, and closer to conventional 4D AVO inversion from post-aligned 4D seismic data. A difference is that the present technological advancement incorporates dvv derived from time shift as low frequency information of elastic AVO inversion. A second option, illustrated in the solid box in FIG. 1, has time shift and AVO inversion iteratively updating each other during the inversion. There's no post-aligned 4D seismic data generated in this inversion scheme. After time shift and initial dvv is calculated from pre-aligned 4D baseline and monitor datasets, a remaining amplitude difference between shifted monitor and baseline data is utilized for AVO inversion, which provides an update to dvv. Updated dvv is integrated to generate a new time shift to re-align baseline and monitor, and a new amplitude difference is generated for AVO inversion. Thus, time shift and amplitude difference keep updating each other to generate P and S impedance change, which fits the amplitude change and guarantees time alignment between baseline and monitor seismic datasets.

AVO inversion is a computer-implemented geophysical method that is used to invert for subsurface properties, such as velocity, density, or impedance. The crux of any geophysical inversion can be described as follows: using a starting subsurface physical property model, synthetic seismic data are generated, i.e. modeled or simulated, by solving the wave equation using a numerical scheme (e.g., finite-difference, finite-element etc.). The term velocity model or physical property model as used herein refers to an array of numbers, typically a 3-D array, where each number, which may be called a model parameter, is a value of velocity or another physical property in a cell, where a subsurface region has been conceptually divided into discrete cells for computational purposes. The synthetic seismic data are compared with the field data (or the 4D difference data in the present example) and using the difference between the two, an error or objective function is calculated. Using the objective function, a modified subsurface model is generated which is used to simulate a new set of synthetic seismic data. This new set of synthetic seismic data is compared with the field data (the 4D difference) to generate a new objective function. This process is repeated w until the objective function is satisfactorily minimized and the final subsurface model is generated.

A rock physics model can be derived from well logs and core measurements. The rock physics model can translate inverted impedance changes into saturation and pressure changes. The ultimate goal is to update a reservoir simulation model using inverted saturation and pressure.

Advantageously, the present technological advancement can combine time shift and amplitude difference using multiple baseline and monitor angle stacks; combine time shift and 4D AVO inversion, which is formulated as a regularized inversion with time strain as prior information, wherein the time strain estimated from time shift could be served as a low frequency model of elastic AVO inversion subsequent to time alignment; time shift and AVO inversion could iteratively update each other during inversion (without post-aligned 4D seismic data being generated); include automatic regularization determined by a line search algorithm with a data driven stopping criteria; and utilize a differential effective medium (DEM) based non-linear rock physics model derived from well logs and core measurements that translate inverted impedance changes into saturation and pressure changes. Main advantages associated with the present technological advancement include: incorporating time shift information into 4D inversion to provide low frequency information not otherwise available, especially for multi-cycle reservoir and to better describe vertical distribution of pressure and saturation changes; reduction in side lobes in 4D seismic data for better interpretation; time shift and AVO inversion iteratively updating each other to better locate and recover the magnitude of 4D signals than sequential time alignment first then inversion on aligned difference; and providing a general inversion method that works on various 4D scenarios, including single cycle and multi-cycle reservoir, as well as time shift dominated and amplitude dominated scenarios; assimilating 4D time shift and AVO information through inversion to further reduce a number of interpretation data and cycle time.

The present technological advancement may be described and implemented in the general context of a system and computer methods to be executed by a computer. Such computer-executable instructions may include programs, routines, objects, components, data structures, and computer software technologies that can be used to perform particular tasks and process abstract data types. Software implementations of the present technological advancement may be coded in different languages for application in a variety of computing platforms and environments. It will be appreciated that the scope and underlying principles of the present invention are not limited to any particular computer software technology.

Moreover, those skilled in the art will appreciate that the present technological advancement may be practiced using any one or combination of hardware and software configurations, including but not limited to a system having single and/or multiple processor computers, hand-held devices, tablet devices, programmable consumer electronics, minicomputers, mainframe computers, and the like. The present technological advancement may also be practiced in distributed computing environments where tasks are performed by servers or other processing devices that are linked through one or more data communications networks. In a distributed computing environment, program modules may be located in both local and remote computer storage media including memory storage devices.

Also, an article of manufacture for use with a computer processor, such as a CD, pre-recorded disk or other equivalent devices, may include a tangible computer program storage medium and program means recorded thereon for directing the computer processor to facilitate the implementation and practice of the present invention. Such devices and articles of manufacture also fall within the spirit and scope of the present technological advancement.

Returning to FIG. 1, step 101 includes inputting baseline seismic data, monitor seismic data, well logs, and core measurements. The monitor survey is usually acquired after a certain time has lapsed since the baseline survey. At this stage, the 4D datasets (the baselines and monitor) are assumed to have gone through a traditional processing sequence to remove acquisition related noise and artifacts like sea swells, statics and any other footprint on the data that is non-geologic. Obtaining the 4D datasets can be arranged in many ways, not just limiting to, full or partial stacks of seismic data, common shot gather, common receiver gather, common image (offset or angle) gathers, common reflection point, offset vector tiles and may be sorted or arranged in different directions such as an inline, crossline or depth/time slices; combinations of these also may be used. One skilled in the art will appreciate that other arrangements of the 4D datasets that are possible can also be used as input for operation 101. Moreover, the seismic datasets could be recorded using active or passive sources and may come from marine surveys like Narrow Azimuth Towed Streamers (NATS), Wide Azimuth Towed Streamers (WATS), Ocean Bottom Cable/Node/Streamer (OBC, OBN, OBS), coil shooting or land-based surveys using geophones or accelerometers in any number of receiver array configurations like 2D surveys, 3D surveys, wide azimuth or full azimuth surveys. Combinations of different source or receiver types may be used. Moreover, one or more of the seismic datasets may be a synthetic data generated using a computer program.

In step 102, the monitor data is cross-equalized to match the baseline in terms of frequency. The baseline dataset may be used as a reference and the monitor as the template, to match to the reference, or it can be vice-versa. Spectral matching, which involves matching the frequency of the monitor to that of the baseline in a global or local sense, can include, but is not limited to, using least squares filters, designed at the overburden to exclude any production related differences due to fluid movement or pressure related changes at the reservoir. Spectral matching usually tries to match the frequency between a baseline and a monitor dataset but the amplitudes are left unchanged. Especially, there could be depth/time and spatially varying amplitude differences in the overburden between the baseline and monitor which could also introduce an over or under exaggerated amplitude difference at the reservoir level.

In step 103, after frequency balance (cross-equalization) between the acquired and processed baseline and monitor datasets, a time shift algorithm is used to calculate time shift between the baseline and monitor datasets. Time shift can be estimated using a cross-correlation method, a Taylor expansion method (Naeini et al., 2009), or a dynamic warping method (Hale, 2007).

In step 104, time strain dvv is deduced from the time shift from either a first derivative or non-linear inversion; depending upon the magnitude, smoothness and geology of the reservoir. Those of ordinary skill in the art can assess their particular situation and choose an appropriate methodology.

If proceeding to step 105 in the dashed box of FIG. 1, step 105 includes taking the time strain dvv derived from time shift and using it as low frequency and prior information for elastic AVO inversion on post-aligned 4D difference angle stacks. Time strain can serve as a low frequency initial model of subsequent elastic AVO inversion, where AVO inversion provides the high frequency update.

Step 106 includes elastic AVO inversion. A regularized inversion scheme can be formulated as follows. A three term Aki & Richards (Aki & Richard, 1980) equation can be adopted to relate angle dependent reflectivity $R(\theta, t)$ and reservoir elastic parameters, such as P-wave velocity (Vp), S-wave velocity (Vs) and density ($\rho$) at baseline survey time t, $$R(\theta, t) = \frac{1}{2}(1 + \tan^2\theta) \cdot \Delta[\ln V_p(t)] - \left(\frac{4\overline{V}_s}{\overline{V}_p}\right)^2 \sin^2\theta \cdot \Delta[\ln V_s(t)] + \frac{1}{2}\left\{1 - \left(\frac{4\overline{V}_s}{\overline{V}_p}\right)^2 \sin^2\theta\right\} \cdot \Delta[\ln\rho(t)]. \quad (1)$$

By convolving with an angle dependent wavelet, seismic angle stacks for baseline are obtained by:

$$[\text{Wavelet}]\begin{bmatrix}\text{Aki \&} \\ \text{Richards}\end{bmatrix}[\text{Derivative}]\begin{bmatrix}\ln V_p \\ \ln V_s \\ \ln\rho\end{bmatrix} = [\text{Base}] \dots \begin{bmatrix}\text{Base}_{\theta 1} \\ \text{Base}_{\theta 2} \\ \text{Base}_{\theta 3}\end{bmatrix}. \quad (2)$$

Defining the first 3 terms of equation 2 as matrix G, equation 2 can be simplified as:

$$G\begin{bmatrix}\ln V_p \\ \ln V_s \\ \ln\rho\end{bmatrix} = [\text{Base}] \dots \begin{bmatrix}\text{Base}_{\theta 1} \\ \text{Base}_{\theta 2} \\ \text{Base}_{\theta 3}\end{bmatrix}. \quad (3)$$

A same set of equations could be deduced for the monitor dataset at monitor survey time t1. Given the linearity of equation 3, subtraction between the monitor and baseline seismic angle stacks could be written as:

$$G \times \begin{bmatrix}\ln(Vp + \Delta Vp) - \ln Vp \\ \ln(Vs + \Delta Vs) - \ln Vs \\ \ln(\rho + \Delta\rho) - \ln\rho\end{bmatrix} = \quad (4)$$

$$G \times \begin{bmatrix}\ln(Vp(1 + \Delta Vp/Vp)) - \ln Vp \\ \ln(Vs(1 + \Delta Vs/Vs)) - \ln Vs \\ \ln(\rho(1 + \Delta\rho/\rho)) - \ln\rho\end{bmatrix} = [\text{Monitor} - \text{Base}]$$

which can be further reduced to:

$$G \times \begin{bmatrix}\ln(1 + \Delta Vp/Vp) \\ \ln(1 + \Delta Vs/Vs) \\ \ln(1 + \Delta\rho/\rho)\end{bmatrix} = [\text{Monitor} - \text{Base}]. \quad (5)$$

If one defines geophysical parameters [$\ln(1+\Delta Vp/V_p)$; $\ln(1+\Delta Vs/Vs)$; $\ln(1+\Delta\rho/\rho)$] to be model vector m and [Monitor-Base] to be data vector d, then equation (5) is the standard linearized G×m=d.

Time shift and deduced time strain (dvv) can be introduced into the inversion scheme as prior information to optimize the following objective function U:

$$U(m,\lambda) = \{\|W(Gm-d)\|_2^2 - \chi_*^2\} + \lambda\|D(m-m_0)\|_2^2, \quad (6)$$

where $\chi_*^2$—the desired level of chi-squared misfit, m—model vector, [$\ln(1+\Delta Vp/Vp)$; $\ln(1+\Delta Vs/Vs)$; $\ln(1+\Delta\rho/\rho)$], G—linear operator that converts model to data, d—data vector, [Monitor−Base], W—data weighting matrix, typically just $1/\sigma_t$ along its main diagonal, where $\sigma_t$ is a standard deviation of the data, $\lambda$—a Lagrange parameter, D—a model damping weighting matrix, which can be square and invertible, typically a diagonal matrix, and $m_0$—prior model vector against which we damp, and can be dvv, which is deduced from time shift.

Equation 6 provides the objective function to be minimized. Instead of arbitrarily choosing regularization parameter $\Delta$, a rigorous line-search method can be used to determine $\Delta$ and establish a data driven stopping criteria for the inversion. Those of ordinary skill in the art are familiar with line search methods, and they can determine search directions and step increments.

By remapping the model space using $\tilde{m}=D(m-m_0)$, the objective function becomes:

$$\tilde{U}(\tilde{m},\Delta) = \{\|W(GD^{-1}\tilde{m}-\hat{d})\|_2^2 - \chi_*^2\} + \lambda\|\tilde{m}\|_2^2, \qquad (7)$$

where $\hat{d} = d - Gm_0$.

The Normal Equations for (7) in the remapped model space, for a given Lagrange parameter, can be written as:

$$\tilde{m}(\lambda) = [(WGD^{-1})^T(WGD^{-1}) + \lambda I]^{-1}[(WGD^{-1})^T W\hat{d}], \qquad (8)$$

wherein I is an identity matrix.

In order to find the stationary point of (7), a minimum deviation from our prior model while meeting the constraint on the expected level of data misfit, one can search over a range of $\lambda$; this is called a line search since it depends only on the scalar abscissa, $\lambda$. The line search is performed until the model, $\tilde{m}_*$, is found where $\|W(GD^{-1}\tilde{m}_*(\lambda)-\hat{d})\|_2^2 = \chi_*^2$. The final solution is mapped back as $m_* = D^{-1}\tilde{m} - m_o$.

To define the desired sum-squared misfit, $\chi_*^2$, and data weights, W, one can compute the variance of the 4D difference data at each trace location. The mean value (over traces) of data variance outside of the reservoir area, which is defined as the 4D noise level, can be used to define $\chi_*^2$ and W. This way, one can obtain a trace-by-trace varying trade-off parameter, $\lambda$, which minimizes the data-oriented portion of the objective function to a desired level of misfit and avoids over-fitting.

Note that for each new $\lambda$ in the line search, (8) requires a new matrix inversion. This repeated computational cost can be avoided by utilizing a Singular Value Decomposition (SVD) on the dense part of the system matrix in (8) such that $U\Sigma V^T = WGD^{-1}$, wherein the properties of the SVD dictate $UU^T = 1$, $VV^T = I$, i.e., U and V are unitary, and $\Sigma$ is a diagonal matrix of non-negative real numbers. After algebraic simplification, the solution for $\tilde{m}(\lambda)$ using the SVD products is then explicitly expressed as:

$$\tilde{m}(\lambda) = V[\Sigma^T\Sigma + \lambda I]^{-1}\Sigma^T U^T W\hat{d} \qquad (9)$$

Note that in (9), the only matrix which is inverted is purely diagonal, thus the additional computational cost per value of $\lambda$ is dramatically reduced relative to (8). The SVD is computed once for each unique $WGD^{-1}$ and its products are reused through matrix multiplication in (9) for each value of $\lambda$ in the line search.

After defining the misfit level from data and obtaining trace varying regularization parameter $\lambda$ using a line search, the method can proceed into one of two different options for the inversion. If coming from step 105 in the dashed box of FIG. 1, the time strain derived from the time shift serves as low frequency and prior information for elastic AVO inversion (step 106) on post-aligned 4D difference angle stacks. If coming from step 103 in the solid box of FIG. 1, time shift and AVO inversion iteratively update each other during the inversion. There is no post-aligned 4D seismic data generated in the solid box part of the method. After time shift and initial dvv is calculated from pre-aligned 4D baseline and monitor datasets, the remaining amplitude difference between the shifted monitor and baseline datasets is utilized for AVO inversion and provides an update to dvv (step 107). Thus, in the solid box of FIG. 1, time shift and amplitude difference keep updating each other to generate P and S impedance changes that fit the amplitude change and provide time alignment between the baseline and monitor datasets.

Step 108 yields optimized values for impedance.

Step 109 includes using well logs and core measurements to generate a rock physics model. A full Xu-White rock physics model (Xu et al., 1995, 1996) can be used, and can be derived from the well logs and core measurements instead of using a linear approximation of a rock physics model to describe the relationship between changes in elastic impedance (P-impedance, S-impedance) and changes in saturation/pressure. The Xu-White rock physics model is a differential effective medium (DEM) based on a non-linear rock physics model, which describes the rock at inclusion or pore level with the extension to capture anisotropy. The full anisotropic Xu-White model can include: (a) dividing the model's pore volume into clay-related pores, sand-related pore, and microcracks; (b) selecting mathematical relationships whereby the division of the pore volume into three parts can be made quantitative based on estimates of over-burden stress and shale volume fraction in the subterranean region; (c) mixing sand grains with clay particles in said model using a first mixing law (e.g., Reuss-Voigt-Hill average); (d) adding wet clay pores with a preferred orientation distribution to the clay related part of the pores volume of said model (e.g., using differential effective media theory; Kuster and Tokzos, 1974); (e) adding empty sand pores and aligned microcracks to the sand and microcrack parts, respectively, of the pores volume of said model (e.g., using differential effective media theory; Kuster and Tokzos, 1974); (f) mixing hydrocarbons with water using a second mixing law; thereby forming a fluid mixture within said model (e.g., Reuss-Voigt-Hill average); (g) placing the fluid mixture into the sand pores and microcracks of said model using anisotropic Gassmann theory; and (h) calibrate parameters in the model using measured data.

Step 109 can include calibrating the Xu-White rock physics model parameter(s) at the well location, performing fluid substitution from in-situ to dry rock using the calibrated Xu-White model (various pores can be added using differential effective media theory and Kuster and Toksoz 1974), applying a pressure effect on the dry rock moduli, and performing fluid substitution back from the dry rock to a desired fluid saturation (pore fluids can be added using Gassman's theory).

Pressure effect can typically be calibrated by core measurements (if available) and can take the following form:

$$Vp = Vp_\infty(1 - Ae^{-p/P0}), \qquad (10)$$

$$Vs = Vs_\infty(1 - Be^{-p/Ps0}), \qquad (11)$$

where parameter A, B, $P_0$ and $P_{s0}$ are determined by core measurements, and the infinity subscript indicates the pressure just before the rock breaks. In most cases, pressure effect on density is ignored.

Rather than use a rock physics model, a reservoir simulation model can be used.

Inverted elastic impedance from Step 108 is then transferred into saturation and pressure changes using the calibrated rock physics model in step 110. A full 3D saturation and pressure change volumes can be generated.

Step 111 can include updating a reservoir model based on the saturation and pressure changes. Seismic derived saturation and pressure changes can be used to benchmark and improve history match in reservoir simulation. It provides a data driven constrain on reservoir simulation model, especially in between wells.

As used herein, "simulate" or "simulation" is the process of performing one or more operations using a subsurface model and any associated properties to create simulation results. For example, a simulation may involve computing a prediction related to the resource extraction based on a reservoir model. A reservoir simulation may involve performing by execution of a reservoir-simulator computer program on a processor, which computes composition, pressure, or movement of fluid as function of time and space for a specified scenario of injection and production wells by solving a set of reservoir fluid flow equations. A geomechanical simulation may involve performing by execution of a geomechanical simulator computer program on a processor, which computes displacement, strain, stress, shear slip, energy release of the rock as a function of time and space in response to boundary conditions, such as displacements or tractions, heat or fluid pressures applied to a geomechanical model with specified initial conditions.

In step 111, a simulation may be performed to generate simulation results. To perform the simulation, the imaging results may be augmented with other data to form a reservoir model or a geologic model that may be utilized to perform flow simulations. The augmentation may include the assignment of additional properties to cells associated with one or more objects or other individual sub-volumes. The properties may include transmissibility, rock type, porosity, permeability, rock compressibility, oil saturation, clay content and/or cementation factors, for example. The performing the simulation may include modeling fluid flow based on the reservoir model and the associated properties stored within the cells of the reservoir model. The simulation results may include the computation of time-varying fluid pressure and fluid compositions (e.g., oil, water and/or gas saturation) and the prediction of fluid volumes produced or injected at wells. The performing the simulation may include modeling structural changes based on the geologic model and the associated properties stored within the cells of the geologic model. For example, reducing reservoir pressure may reduce porosity which may lead to a sagging overburden. The simulation results and/or the reservoir model may be outputted. The outputting of the simulation results may include displaying the simulation results, which may include generated data as well as the geologic model and/or the reservoir model, on a monitor and/or storing the simulation results in memory of a computer system. The simulation may model fluid flow or geomechanical imaging for different time steps in a set period of time, based on subsurface parameters and/or boundary conditions for each time step, and/or generated data from previous time steps. The subsurface parameters may include mechanical rock properties (e.g., elastic moduli, plasticity parameters), poroelastic parameters, tensile and unconfined compressive strength, contact rules and frictional properties of rock interfaces, number, thickness and distribution of individual rock layers, fault geometry and frictional properties, porosity, pore pressures, thermal coefficients and other suitable parameters.

At step 111, the simulation results and/or the imaging results may be utilized to perform hydrocarbon operations. The hydrocarbon operations may include hydrocarbon exploration operations, hydrocarbon development operations and/or hydrocarbon production operations. For example, the simulation results and/or the imaging results may be used to estimate or adjust reserves forecasts, reserves estimations and/or well performance prediction. As another example, the imaging results may be used to provide the positive or negative flow performance test results from a well that has been already drilled, or to screen potential subsurface regions for producibility prior to acquiring acreage and committing to a drill well program or to determine which geologic layers are beneficial to perforate or perform enhanced completion practices such as hydraulic fracturing, upon drilling of a production well. As another example, the results may be used to determine if there is sufficient pressure communication between a hydrocarbon reservoir and a water aquifer necessary to provide fluid pressure support for economic production with or without involving additional injection wells. As another example, the connectivity of the pore networks may be used to assess the integrity of high capillary entry pressure seal layers overlying reservoir rocks to determine the likelihood of the presence or absence of quantities of hydrocarbons in the underlying subsurface reservoir that depend on the seal integrity not being destroyed by the presence of connected pore networks. As another example, the simulation results and/or the imaging results may be used to adjust hydrocarbon production operations, such as installing or modifying a well or completion, modifying or adjusting drilling operations, decreasing fracture penetration, and/or to installing or modifying a production facility. The production facility may include one or more units to process and manage the flow of production fluids, such as hydrocarbons and/or water, from the formation.

The following is a discussion of exemplary applications of the present technological advancement; first on a synthetic wedge model and then on a multi-cycle stacked deep water reservoir. These examples pertain to the steps in the solid box on FIG. 1.

Figure 2:
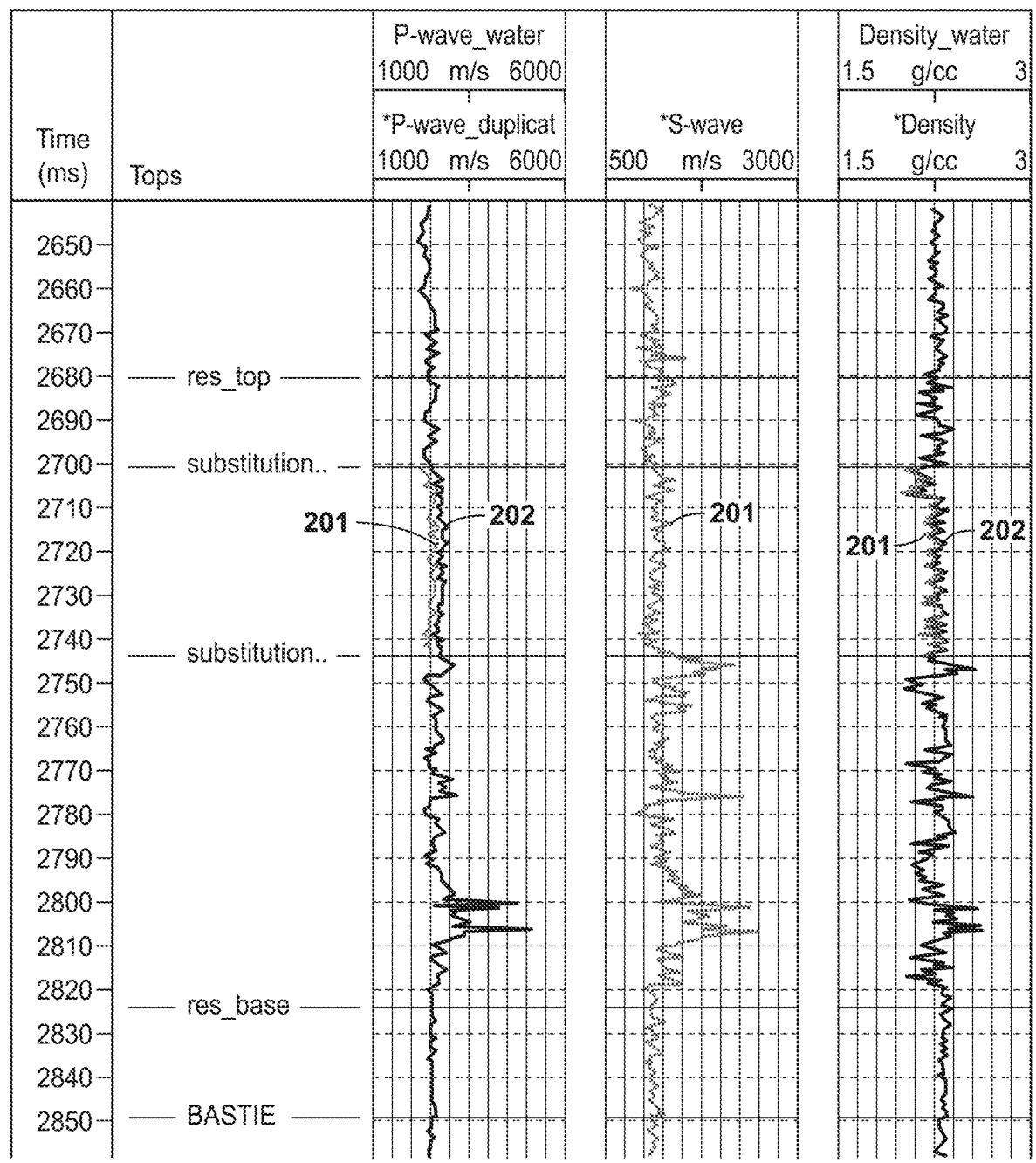
FIG. 2 illustrates in-situ logs for P-wave, S-wave, and density.
Figure 3:
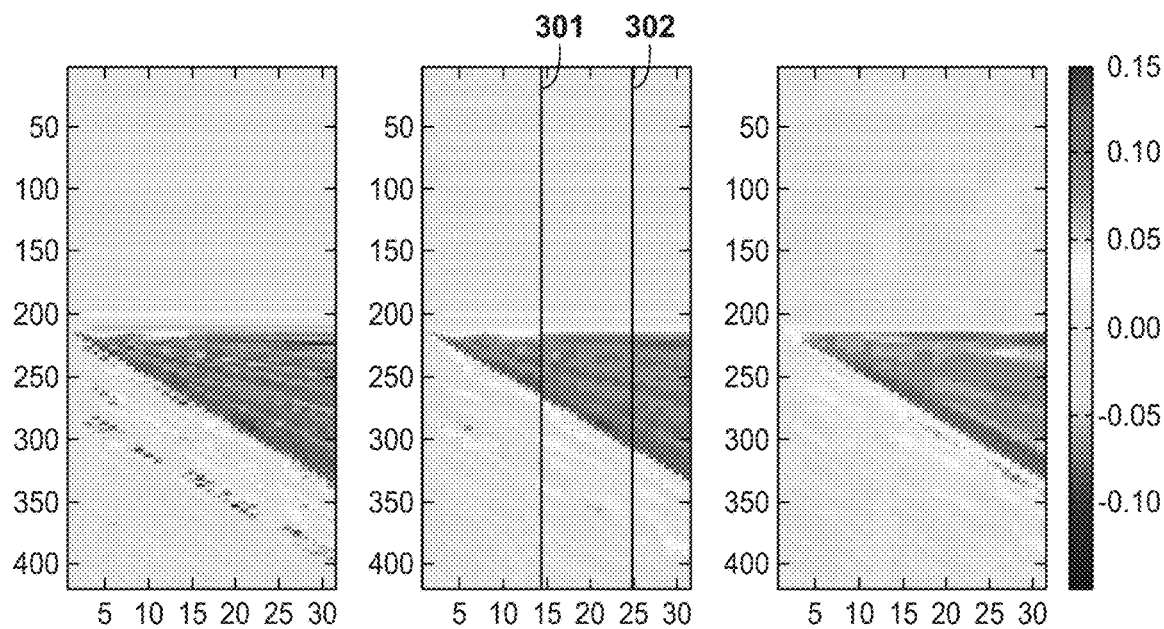
FIG. 3 illustrates a synthetic 4D wedge model with saturation changes.

FIG. 2 shows in-situ logs 201 for P-wave, S-wave and density. Fluid substitution is done on logs to 100% water saturation shown as 202 (wherein 201 and 202 are overlapping for density). Changes in S-wave are small enough to be neglected. Synthetic wedge models are built from in-situ logs as baseline data and from fluid substituted logs as monitor data by convolving a 25 Hz Ricker wavelet. FIG. 3 shows the true velocity change (dVp) from well logs and filtered to seismic frequency range. The left most image in FIG. 3 shows the true log velocity change (dVp) after fluid substitution, the middle image shows the true dVp filtered to seismic frequency (e.g., same bandwidth for data and logs), and the right most image shows inverted dVp from baseline seismic data built on in situ logs and monitor seismic data built on fluid substituted logs.

Figure 4A:
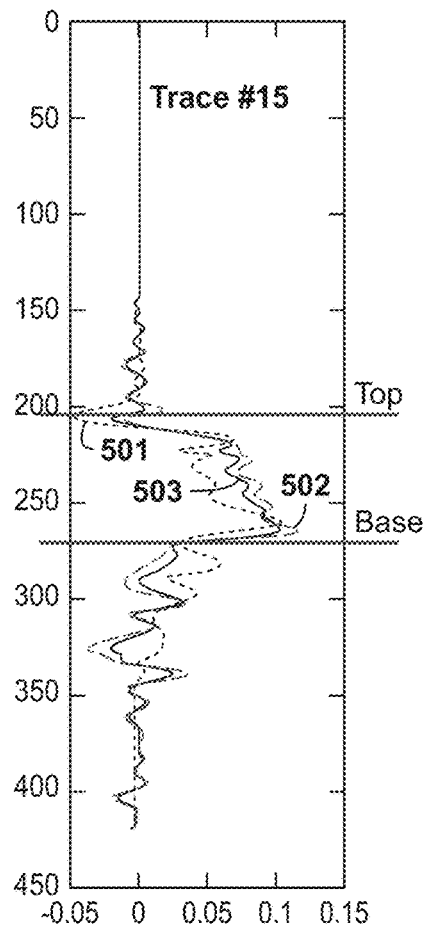
FIG. 4A illustrates inverted dIp from the wedge model at trace location #15.
Figure 4B:
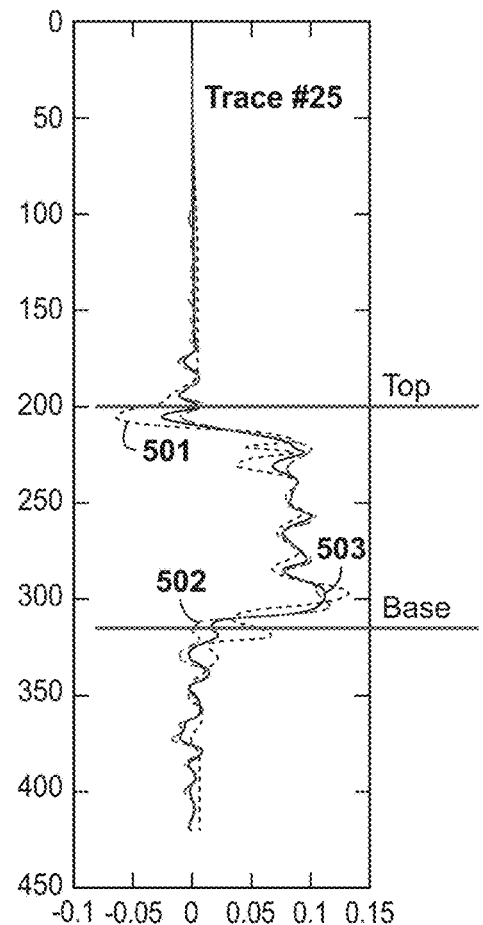
FIG. 4B illustrates inverted dIp from the wedge model at trace location #25.

Conventional amplitude inversion as well as the proposed joint inversion methods are applied to the synthetic wedge baseline and monitor seismic datasets. FIGS. 4A and 4B illustrates inverted dIp from the wedge model at trace location #15 and #25 shown at lines 301 and 302 in FIG. 3. Curve 503 shows filtered true dIp from a log. Curve 502 shows inverted dIp from time shift and amplitude joint inversion in accordance with the present technological advancement. Curve 501 shows inverted dIp from conventional amplitude alone. Joint inversion of the present technological advancement gives better results compared with convention amplitude inversion at different parts of the wedge model. It also confines better at top and base of the reservoir (see top region in FIGS. 4A and B).

The present technological advancement is applicable to inverting with baseline and monitor datasets sequentially and then obtaining the difference between their respective updated models, as well as inverting with the 4D difference volume (as discussed above). Also, the present technological advancement is applicable to multi-vintage monitor inversion.

The foregoing application is directed to particular embodiments of the present technological advancement for the purpose of illustrating it. It will be apparent, however, to one skilled in the art, that many modifications and variations to the embodiments described is herein are possible. All such modifications and variations are intended to be within the scope of the present invention, as defined in the appended claims. Persons skilled in the art will readily recognize that in preferred embodiments of the invention, some or all of the steps in the present inventive method are performed using a computer, i.e. the invention is computer implemented. In such cases, the resulting gradient or updated physical properties model may be downloaded or saved to computer storage.

The following references are hereby incorporated by reference in their entirety:

Tura, A., and D. E. Lumley, 1999, Estimating pressure and saturation changes from time-lapse AVO data: 69th Annual International Meeting, SEG, Expanded Abstracts, 1655-1658;

Landro, M., 2001, Discrimination between pressure and fluid saturation changes from time-lapse seismic data: Geophysics, 66, 836-844;

Cole, S., D. Lumley, M. Meadows, and A. Tura, 2002, Pressure and saturation inversion of 4D seismic data by rock physics forward modeling: 72nd Annual International Meeting, SEG, Expanded Abstracts, 2475-2478;

Lumley, D., M. Meadows, S. Cole, and D. Adams, 2003, Estimation of reservoir pressure and saturation by crossplot inversion of 4D seismic attributes: 73rd Annual International Meeting, SEG, Expanded Abstracts, 1513-1516;

De Nicolao, A., G. Drufuca, and F. Rocca, 1993, Eigenvalues and eigenvectors of linearized elastic inversion: Geophysics, 58, 670-679;

Blanchard, T. D., 2012, Inherent uncertainties in 4D AVO and the implications on pressure and saturation inversion: 74th Conference and Exhibition, EAGE, Extended Abstracts, Y020;

Rickett, J. E., and D. E. Lumley, 2001, Cross-equalization data processing for time-lapse seismic reservoir monitoring: A case study from the Gulf of Mexico, Geophysics, 66, 1015-1025;

Tian, S., and C. MacBeth, 2015, An engineering-consistent Bayesian scheme for 4D seismic to simulator inversion, 77th EAGE Conference and Exhibition 2015;

Edgar, J. A., and T. D. Blanchard, 2015, Imposing geological and geomechanical constraints on time-lapse time strain inversion, 77th EAGE Conference and Exhibition 2015;

Griffiths, L., T. D. Blanchard, J. A. Edgar and M. S. Shahraeeni, 2015, Trace warping vs. impedance warping in 4D seismic inversion, 77th EAGE Conference and Exhibition 2015;

Williamson, P. R., A. J. Cherrett and P. A. Sexton, 2007, A new approach to warping for quantitative time-lapse characterization, 69th EAGE Conference and Exhibition 2007;

Micksch, U., I. H. Herbert, A. J. Cherrett, H. Roende, M. A. Calvert and J. Zaske, 2014, Integrated 4D inversion approach in Danish chalk fields, 76th EAGE Conference and Exhibition 2014;

U.S. Pat. No. 8,483,964; and
U.S. Pat. No. 8,908,474.

The invention claimed is:

1. A method for inversion of 4D seismic data, the method comprising:
(a) determining time shift between baseline and monitor geophysical datasets;
(b) determining time strain from the time shift;
(c) iteratively repeating until a stopping criteria is satisfied, performing an iterative elastic amplitude offset variation (AVO) inversion with a 4D difference providing an update, from an initial model including the time strain, to generate an updated time strain and an updated physical property model, wherein the stopping criteria is a misfit between synthetic data generated from the updated physical property model and the 4D difference being within a predetermined noise level,
wherein for each successive iteration, the method includes generating an updated time shift from the updated time strain, generating an updated 4D difference from the updated time strain, generating a new time strain from the updated 4D difference, and repeating step (c) with the updated 4D difference and the new time strain;
(d) generating final values for the physical property model; and
(e) converting, with a rock physics model or a reservoir simulation model, the final values to saturation and/or pressure changes for a subsurface region.

2. The method of claim 1, wherein the elastic AVO inversion is performed sequentially with first the baseline dataset and secondly the monitor dataset, and the updated models from each are subtracted to have the 4D difference provide the update.

3. The method of claim 1, wherein the elastic AVO inversion is performed on the 4D difference.

4. The method of claim 1, wherein the final values for the physical property model are P- and S-impedance.

5. The method of claim 1, wherein the rock physics model is calibrated at a well location.

6. The method of claim 5, wherein the rock physics model is further calibrated with core measurements.

7. The method of claim 1, further comprising performing a reservoir simulation using the saturation and/or pressure changes for the subsurface region.

8. The method of claim 1, wherein the baseline and monitor geophysical datasets are pre-aligned 4D angle stacks.

9. The method of claim 1, wherein the noise level is determined from a data variance in a non-production part of the reservoir.

10. The method of claim 1, wherein the elastic AVO inversion uses a cost function with a trace by trace varying regularization parameter.

11. The method of claim 1, wherein the performing the elastic AVO inversion includes using SVD (singular value decomposition) to solve for an update to the physical property model.

12. A method for inversion of 4D seismic data, the method comprising:
(a) determining time shift between baseline and monitor geophysical datasets;
(b) determining time strain from the time shift;
(c) determining a noise level for a 4D difference between the baseline an monitor geophysical datasets; and
(c) performing an iterative elastic amplitude offset variation (AVO) inversion, until a stopping criteria is satisfied, with a 4D difference providing an update, from an initial model including the time strain, to generate an updated physical property model, wherein the stopping criteria is a misfit between synthetic data generated from the updated physical property model and the 4D difference being within a predetermined noise level, and wherein the time strain serves as low frequency information on the 4D difference.

13. A non-transitory computer readable storage medium encoded with instructions, which when executed by a computer causes the computer to implement a method for inversion of 4D seismic data, the method comprising:
(a) determining time shift between baseline and monitor geophysical datasets;
(b) determining time strain from the time shift;
(c) iteratively repeating until a stopping criteria is satisfied, performing an iterative elastic amplitude offset variation (AVO) inversion with a 4D difference providing an update, from an initial model including the time strain, to generate an updated time strain and an updated physical property model, wherein the stopping criteria is a misfit between synthetic data generated from the updated physical property model and the 4D difference being within a predetermined noise level,
wherein for each successive iteration, the method includes generating an updated time shift from the updated time strain, generating an updated 4D difference from the updated time strain, generating a new time strain from the updated 4D difference, and repeating step (c) with the updated 4D difference and the new time strain;
(d) generating final values for the physical property model; and
(e) converting, with a rock physics model or a reservoir simulation model, the final values to saturation and/or pressure changes for a subsurface region.

* * * * *